United States Patent
Ogata et al.

(10) Patent No.: US 9,158,151 B2
(45) Date of Patent: Oct. 13, 2015

(54) SURFACE LIGHT-EMITTING UNIT AND DISPLAY DEVICE PROVIDED WITH THE SAME

(75) Inventors: Nobuo Ogata, Osaka (JP); Mitsuru Hineno, Osaka (JP); Shinji Suminoe, Osaka (JP)

(73) Assignee: Sharp Kabushiki Kaisha, Osaka-shi (JP)

( * ) Notice: Subject to any disclaimer, the term of this patent is extended or adjusted under 35 U.S.C. 154(b) by 115 days.

(21) Appl. No.: 13/502,693

(22) PCT Filed: Nov. 9, 2010

(86) PCT No.: PCT/JP2010/069934
§ 371 (c)(1),
(2), (4) Date: Apr. 18, 2012

(87) PCT Pub. No.: WO2011/062089
PCT Pub. Date: May 26, 2011

(65) Prior Publication Data
US 2012/0206673 A1     Aug. 16, 2012

(30) Foreign Application Priority Data
Nov. 17, 2009  (JP) ................. 2009-262339

(51) Int. Cl.
*G02F 1/1335* (2006.01)
(52) U.S. Cl.
CPC .... *G02F 1/133603* (2013.01); *G02F 1/133611* (2013.01); *G02F 2202/28* (2013.01)
(58) Field of Classification Search
CPC .............................. G02F 1/133611
USPC ................................................ 349/69
See application file for complete search history.

(56) References Cited

U.S. PATENT DOCUMENTS

| | | | |
|---|---|---|---|
| 6,486,974 B1 * | 11/2002 | Nakai et al. ............... | 358/1.9 |
| 2008/0007966 A1 * | 1/2008 | Ohkawa ................. | 362/608 |
| 2008/0084699 A1 | 4/2008 | Park et al. | |
| 2008/0286536 A1 * | 11/2008 | Burmeister et al. ......... | 428/201 |
| 2008/0297020 A1 | 12/2008 | Wanninger et al. | |

(Continued)

FOREIGN PATENT DOCUMENTS

| | | |
|---|---|---|
| EP | 2 098 905 | 9/2009 |
| JP | 2005-44661 | 2/2005 |

(Continued)

OTHER PUBLICATIONS

International Search Report mailed Dec. 14, 2010, directed to International Application No. PCT/JP2010/069934; 4 pages.

(Continued)

Primary Examiner — Bumsuk Won
Assistant Examiner — Edmond Lau
(74) Attorney, Agent, or Firm — Morrison & Foerster LLP

(57) ABSTRACT

A surface light-emitting unit of the present invention is an LED module (30) for emitting light from an LED chip (6) of a light-emitting element part (1) via a light flux control section (22) of a light flux control part (2), the light flux control section (22) being fixed by a plurality of columnar sections (21) above a fixing surface of a substrate (4) on which fixing surface the light-emitting element part (1) is fixed. This provides an appropriate gap between the light-emitting element part (1) and the light flux control section (22) for heat release.

18 Claims, 12 Drawing Sheets

(56) References Cited

U.S. PATENT DOCUMENTS

| | | | |
|---|---|---|---|
| 2008/0298060 A1* | 12/2008 | Ohkawa | 362/240 |
| 2009/0046456 A1 | 2/2009 | Urano et al. | |
| 2009/0116245 A1* | 5/2009 | Yamaguchi | 362/311.01 |
| 2010/0220461 A1 | 9/2010 | Naijo | |
| 2011/0044053 A1* | 2/2011 | Yamaguchi | 362/296.05 |

FOREIGN PATENT DOCUMENTS

| | | |
|---|---|---|
| JP | 2005-93622 | 4/2005 |
| JP | 2006-324256 | 11/2006 |
| JP | 2007-115424 | 5/2007 |
| JP | 2009-117207 | 5/2009 |
| JP | 2011-44411 | 3/2011 |
| KR | 10-2006-0135498 | 12/2006 |
| KR | 10-2008-008306 | 9/2008 |
| WO | WO-2008/149921 | 12/2008 |

OTHER PUBLICATIONS

Extended European Search Report dated Mar. 18, 2014, directed to EP Application No. 10831484.0; 3 pages.

* cited by examiner

SURFACE LIGHT-EMITTING UNIT AND DISPLAY DEVICE PROVIDED WITH THE SAME

REFERENCE TO RELATED APPLICATIONS

This application is the national stage under 35 USC 371 of International Application No. PCT/JP2010/069934, filed Nov. 9, 2010, which claims priority from Japanese Patent Application No. 2009-262339, filed Nov. 17, 2009, the entire contents of which are incorporated herein by reference.

FIELD OF THE INVENTION

The present invention relates to a surface light-emitting unit including a light-emitting element module usable in a backlight module for a liquid crystal TV, lighting equipment etc.

BACKGROUND OF THE INVENTION

There have been developed surface light-emitting devices employing solid state light-emitting elements such as LEDs (Light Emitting Diode) as point light-sources.

Recently, such surface light-emitting devices employing point light-sources are used as backlights in display apparatuses such as liquid crystal TVs and liquid crystal monitors and as lighting equipment etc.

In general, surface light-emitting devices employing point light sources are tend to exhibit luminance unevenness because the light sources are point-like. Accordingly, various ingenuities are required in order to make luminance at the light-emitting surface even. For example, Patent Literatures 1 and 2 disclose surface light source devices designed such that light flux control members are provided at light-emitting surface sides of light-emitting elements (point light sources) in order to control angles of beams of light emitted from the light-emitting elements and smoothly broadening emitted light flux in a wide range, so that the beams of light from the light-emitting elements are more likely to be mixed with each other and luminance of emitted beams of light become even, thereby overcoming luminance unevenness.

In the surface light source device disclosed in Patent Literature 1, as shown in FIGS. 14(a) to 14(c), a light-emitting device (light-emitting element module) is designed such that a flat portion at a back surface 102a of an light flux control member 102 is attached and fixed to a fixing substrate 104 of a light-emitting element 101. Consequently, the light-emitting element 101 is completely covered with the light flux control member 102. This raises a problem that heat from the light-emitting element 101 is difficult to be released.

In order to deal with this problem, in the surface light source device disclosed in Patent Literature 2, as shown in FIG. 15(a), a light-emitting device (light-emitting element module) is designed such that a flat portion at a back surface 102a of an light flux control member 102 is fixed to a fixing substrate 104 of a light-emitting element 101 via a plurality of columnar members 105. This structure allows securing a space for releasing heat around the light-emitting element 101.

Japanese Patent Application Publication, Tokukai, No. 2006-324256 (published on Nov. 30, 2006)

Japanese Patent Application Publication, Tokukai, No. 2009-117207 (published on May 28, 2009)

SUMMARY OF INVENTION

In the light-emitting device disclosed in Patent Literature 2, as shown in FIG. 15(b), end parts 105a of the columnar members 105 of the light flux control member 102 are fixed to the fixing substrate 104 in such a manner that the end parts 105a penetrate through-holes 104a in the fixing substrate 104 and are thermally adhered there.

However, when the light flux control member 102 is fixed to the fixing substrate 104 as above, the end parts 105a of the columnar members 105 protrude from a back surface 104b of the fixing substrate 104 to form protruding portions. These protruding portions on the back surface 104b of the fixing substrate 104 raise various problems.

For example, in a case where the light emitting device is mounted on a chassis constituting a housing of an electronic apparatus to form a surface light-emitting device, the protruding portions on the back surface 104b of the fixing substrate 104 included in the light emitting device make it difficult to keep parallel between the light emitting device and the chassis, causing variations in distance between individual light emitting elements and a light-emitting surface of the surface light-emitting device, being more likely to cause luminance unevenness.

Furthermore, the protruding portions lower the degree of adhesion between the light emitting device and the chassis, so that thermal conduction from the light emitting device to the chassis drops. Consequently, in a case where the light emitting element used in the light emitting device is an LED, the LED suffers lowered heat release property and therefore lowered luminance.

Lowered heat release property of the LED also raises a problem that the life of the LED is shortened.

One possible solution to the drop in luminance of the LED resulting from the protruding portions lowering the degree of adhesion between the light emitting device and the chassis is supplying a more amount of current to the LED. However, this solution increases the amount of heat from the LED, raising a problem that heat release property is worsened.

Another possible solution to the drop in luminance of the LED is separately providing an optical sheet for increasing luminance. However, this raises a problem that the cost for manufacturing the device increases.

As described above, the conventional technique suffers problems such as luminance unevenness due to the drop in luminance resulting from worsening of heat release property of the LED serving as a light emitting element and increase in the cost for manufacturing the device due to equipping the device with a solution to luminance unevenness.

In view of the above, by fixing the columnar members 105 onto the fixing substrate 104 via adhesive resin so that the columnar members 105 do not protrude from the back surface of the fixing substrate 104, it is possible to solve the aforementioned problems resulting from the protruding portions on the back surface 104b of the fixing substrate 104.

However, fixing the fixing substrate and the columnar members via adhesive resin raises a problem that optical absorption of resin at the adhering parts darkens a space around the columnar members or a space in a direction in which the columnar members are formed when seen from the light-emitting element, so that a light-emitting surface of a surface light-emitting unit exhibits luminance unevenness.

The present invention was made in view of the foregoing problems. An object of the present invention is to provide a surface light-emitting unit without luminance unevenness at its light-emitting surface and a display device provided with the surface light-emitting unit.

In order to solve the foregoing problems, a surface light-emitting unit of the present invention is a surface light-emitting unit for emitting light from a light-emitting element via a light flux control member, the light flux control member being supported by a plurality of support members each having a predetermined height above a fixing surface of a fixing substrate on which fixing surface the light-emitting element is fixed, and at least one of the plurality of support members being adhered to the fixing substrate via adhesive resin made of a resin material whose color exhibits a smaller amount of optical absorption at a visible light region than black.

With the arrangement, there are provided support members having a predetermined height between the light flux control member and the fixing substrate, so that an appropriate gap corresponding to the height of the support members is secured around the light-emitting element fixed on the fixing substrate. Accordingly, it is possible to release, via the gap, heat resulting from emission by the light-emitting element, so that there is no possibility of drop in luminance resulting from worsened heat release of the light-emitting element.

Furthermore, since the light flux control member is supported by the support members having a predetermined height above the fixing surface (front surface) of the fixing substrate on which fixing surface the light-emitting element is fixed, the support members do not protrude from the surface (back surface) of the fixing substrate which is opposite to the fixing surface (front surface) of the fixing substrate on which fixing surface the light-emitting element is fixed. Consequently, the back surface of the fixing substrate is kept flat.

Consequently, in a case of a light-emitting device obtained by fixing the surface light-emitting unit to a chassis constituting a housing of an electronic device for example, the back surface of the fixing substrate constituting the surface light-emitting unit can be adhered to the chassis, so that the distance between each light-emitting element of the surface light-emitting unit and a light-emitting surface of the surface light source device can be kept constant. Consequently, there occurs no luminance unevenness resulting from variations in the distance.

Furthermore, since the fixing substrate constituting the surface light-emitting unit is closely attached to the chassis, heat from the light-emitting element can be released via the chassis. Consequently, drop in luminance due to insufficient heat release of the light-emitting element can be further subdued.

Consequently, it is unnecessary to increase power supply or separately provide an optical sheet for increasing luminance in order to cover the drop in luminance of the light-emitting element.

The height of the support members is not particularly limited as long as the height secures a gap between the light flux control member and the fixing substrate which gap allows releasing heat from the light-emitting element.

Furthermore, in the surface light-emitting unit with the above arrangement, since at least one of the plurality of support members is adhered to the fixing substrate via adhesive resin made of a resin material whose color exhibits a smaller amount of optical absorption at a visible light region than black, it is possible to reduce optical absorption at a visible light region by the resin at the portion where said at least one of the plurality of support members is attached. Consequently, a space around the support members and spaces in directions in which the support members are formed when seen from the light-emitting element are not darkened, so that luminance unevenness at the light-emitting surface of the surface light-emitting unit can be reduced.

A preferable example of the color which exhibits a smaller amount of optical absorption at a visible light region than black is white or transparent. Such a color allows eliminating luminance unevenness at the light-emitting surface.

In order to solve the foregoing problem, a surface light-emitting unit of the present invention is a surface light-emitting unit for emitting light from a light-emitting element via a light flux control member, the light flux control member being supported by a plurality of support members each having a predetermined height above a fixing surface of a fixing substrate on which fixing surface the light-emitting element is fixed, and only one of the plurality of support members being adhered and fixed to the fixing substrate via adhesive resin.

With the arrangement, there are provided support members having a predetermined height between the light flux control member and the fixing substrate, so that an appropriate gap corresponding to the height of the support members is secured around the light-emitting element fixed on the fixing substrate. Accordingly, it is possible to release, via the gap, heat resulting from emission by the light-emitting element, so that there is no possibility of drop in luminance resulting from worsened heat release of the light-emitting element.

Furthermore, since the light flux control member is supported by the support members having a predetermined height above the fixing surface (front surface) of the fixing substrate on which fixing surface the light-emitting element is fixed, the support members do not protrude from the surface (back surface) of the fixing substrate which is opposite to the fixing surface (front surface) of the fixing substrate on which fixing surface the light-emitting element is fixed. Consequently, the back surface of the fixing substrate is kept flat.

Consequently, in a case of a light-emitting device obtained by fixing the surface light-emitting unit to a chassis constituting a housing of an electronic device for example, the back surface of the fixing substrate constituting the surface light-emitting unit can be adhered to the chassis, so that the distance between each light-emitting element of the surface light-emitting unit and a light-emitting surface of the surface light source device can be kept constant. Consequently, there occurs no luminance unevenness resulting from variations in the distance.

Furthermore, since the fixing substrate constituting the surface light-emitting unit is closely attached to the chassis, heat from the light-emitting element can be released via the chassis. Consequently, drop in luminance due to insufficient heat release of the light-emitting element can be further subdued.

Consequently, it is unnecessary to increase power supply or separately provide an optical sheet for increasing luminance in order to cover the drop in luminance of the light-emitting element.

The height of the support members is not particularly limited as long as the height secures a gap between the light flux control member and the fixing substrate which gap allows releasing heat from the light-emitting element.

Furthermore, in the surface light-emitting unit with the above arrangement, since only one support member is fixed to the fixing substrate via the adhesive resin, it is possible to reduce the influence of luminance unevenness resulting from the adhesive resin compared with a case where all the support members are fixed to the fixing substrate via the adhesive resin.

When a display device including a liquid crystal panel is designed to use the aforementioned surface light-emitting unit as a backlight for radiating light to the liquid crystal panel from a back surface thereof, it is possible to radiate light with even luminance and without luminance unevenness to the liquid crystal panel. Accordingly, it is possible to increase display quality of the liquid crystal panel, particularly display quality when displaying a moving image.

A surface light-emitting unit of the present invention is a surface light-emitting unit for emitting light from a light-emitting element via a light flux control member, the light flux control member being fixed by a plurality of fixing members each having a predetermined thickness above a fixing surface of a fixing substrate on which fixing surface the light-emitting element is fixed, so that heat release property of the light emitting element is prevented from being worsened. Thus, it is possible to provide an inexpensive surface light-emitting unit which exhibits no luminance unevenness at a light-emitting surface.

Figure 4:
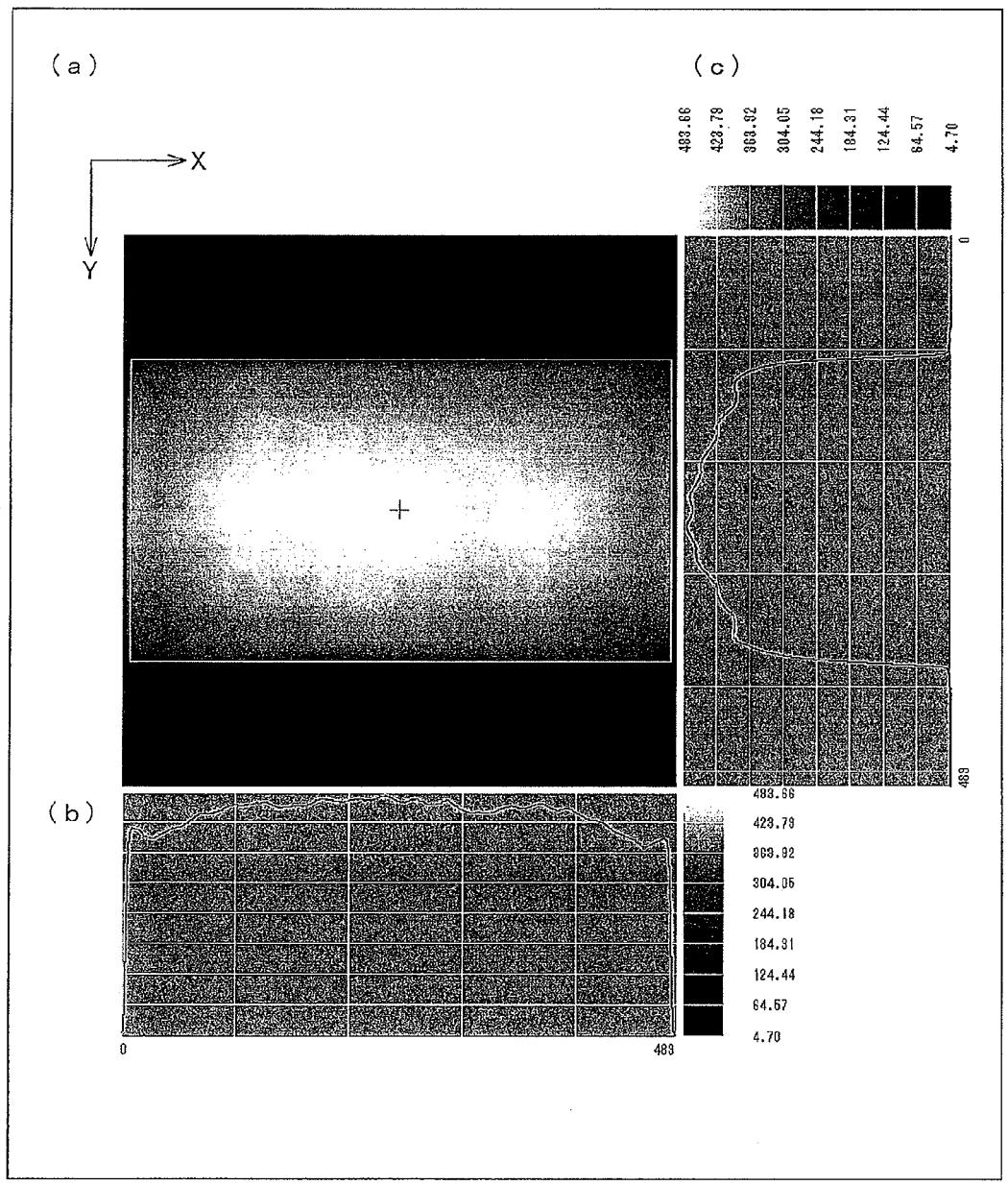
FIG. 4

(a) to (c) of FIG. 4 are views showing the result of measurement of luminance unevenness in a liquid crystal module in accordance with a Comparative Example of the present invention.

FIG. 5

Figure 3:
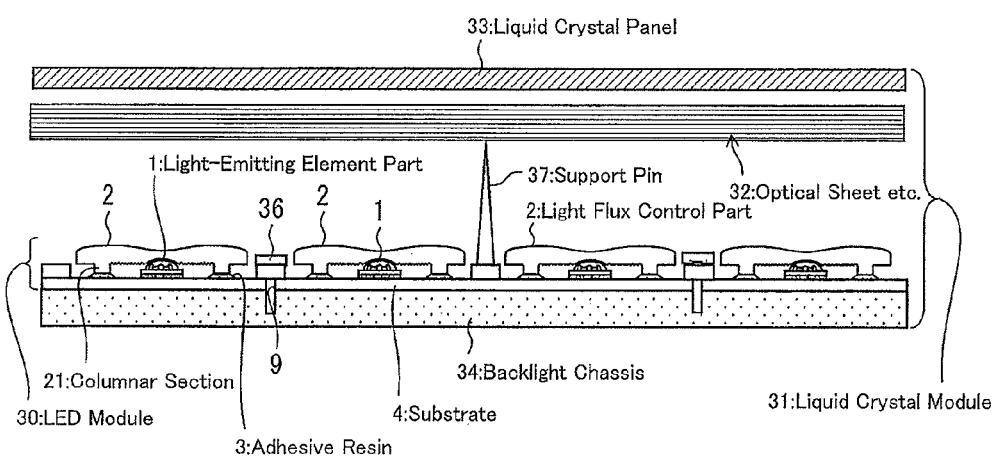
FIG. 3 is a cross sectional view schematically showing a liquid crystal module in which the light-emitting element module shown in FIG. 1 is used as a backlight.
Figure 5:
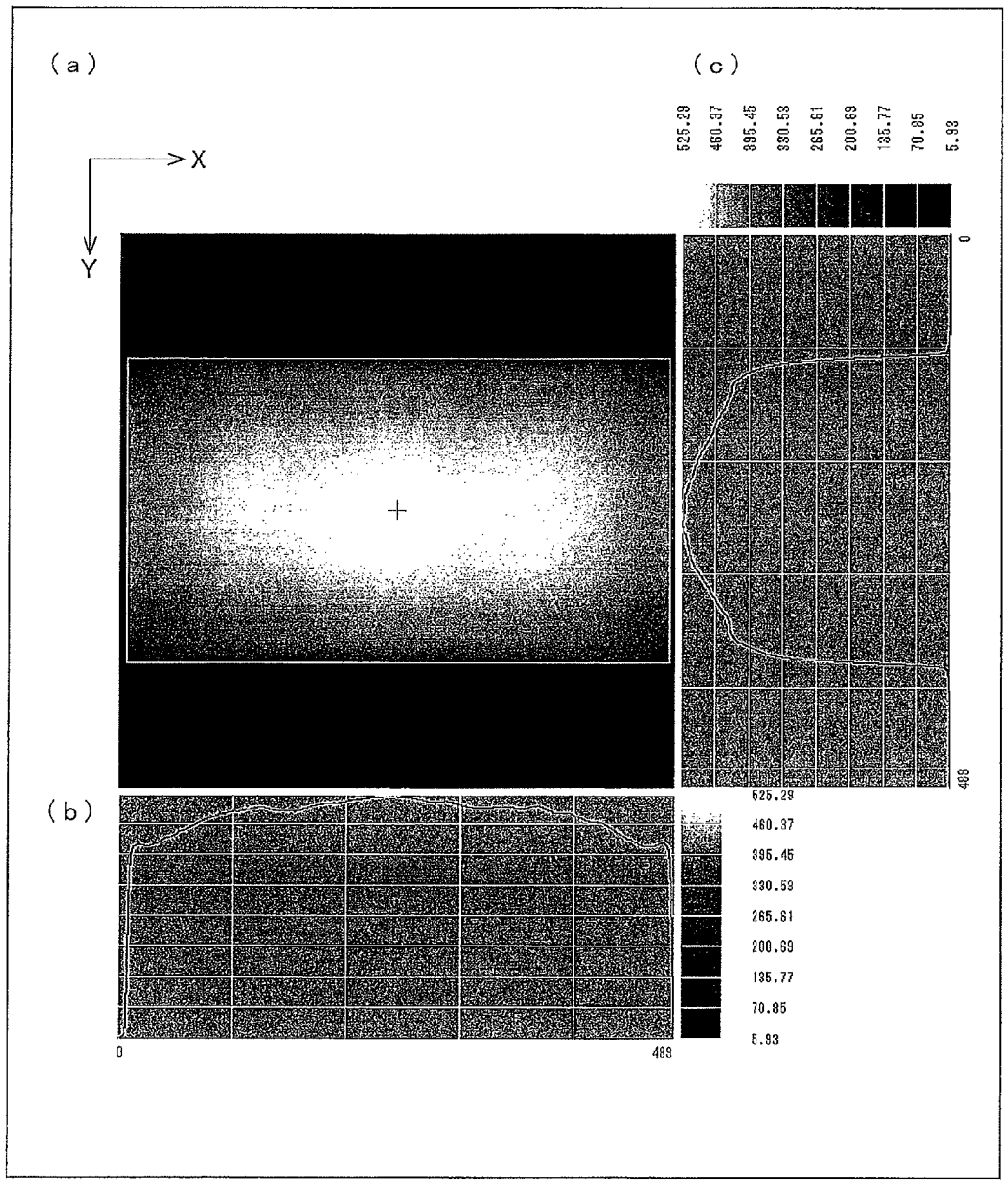

(a) to (c) of FIG. 5 are views showing the result of measurement of luminance unevenness in the liquid crystal module shown in FIG. 3.

FIG. 6

Figure 1:
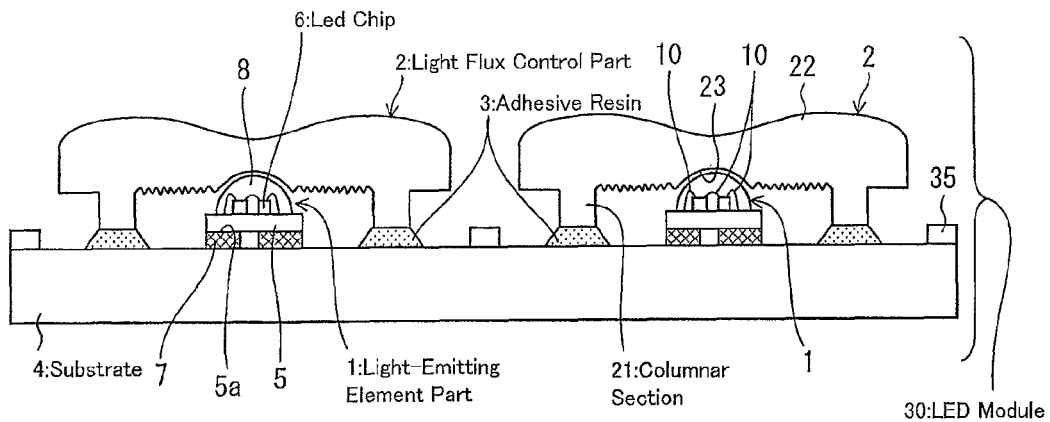
FIG. 1 is a cross sectional view schematically showing a light-emitting element module in accordance with an embodiment of the present invention.
Figure 6:
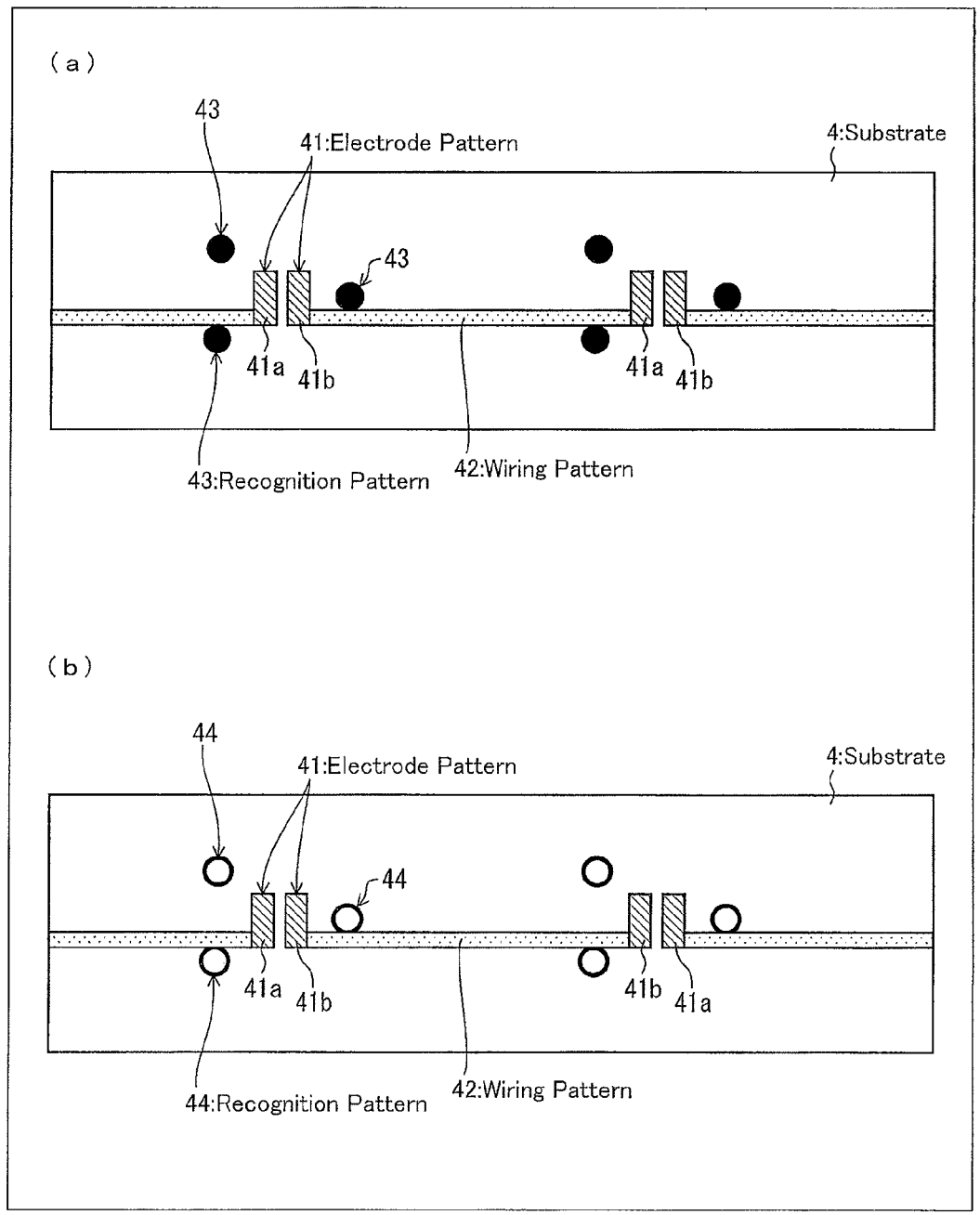

(a) and (b) of FIG. 6 are explanatory views showing substrate patterns on a fixing substrate included in the light-emitting element module shown in FIG. 1.

Figure 2:
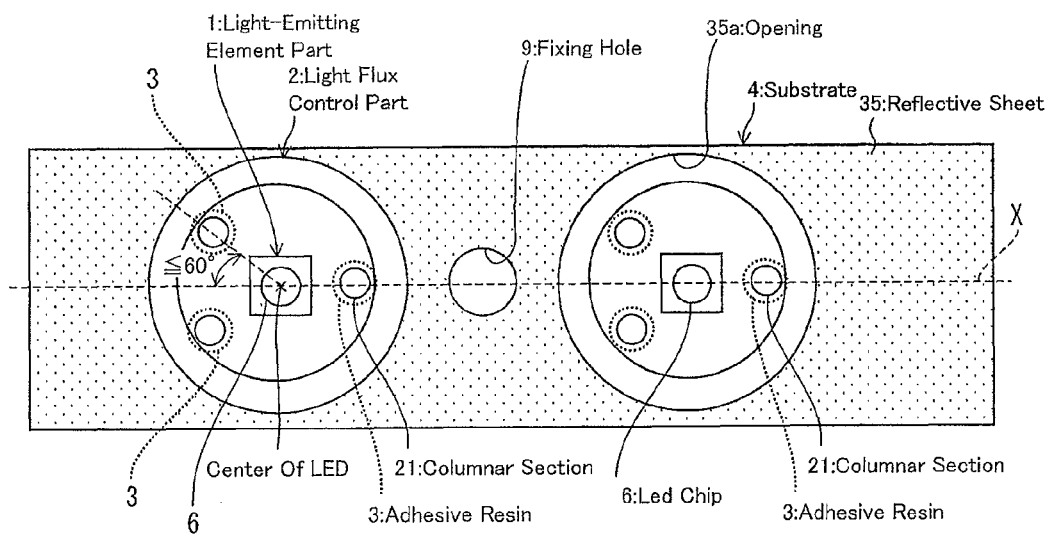
FIG. 2 is a top view showing the light-emitting element module shown in FIG. 1 when it is seen from above.
Figure 7:
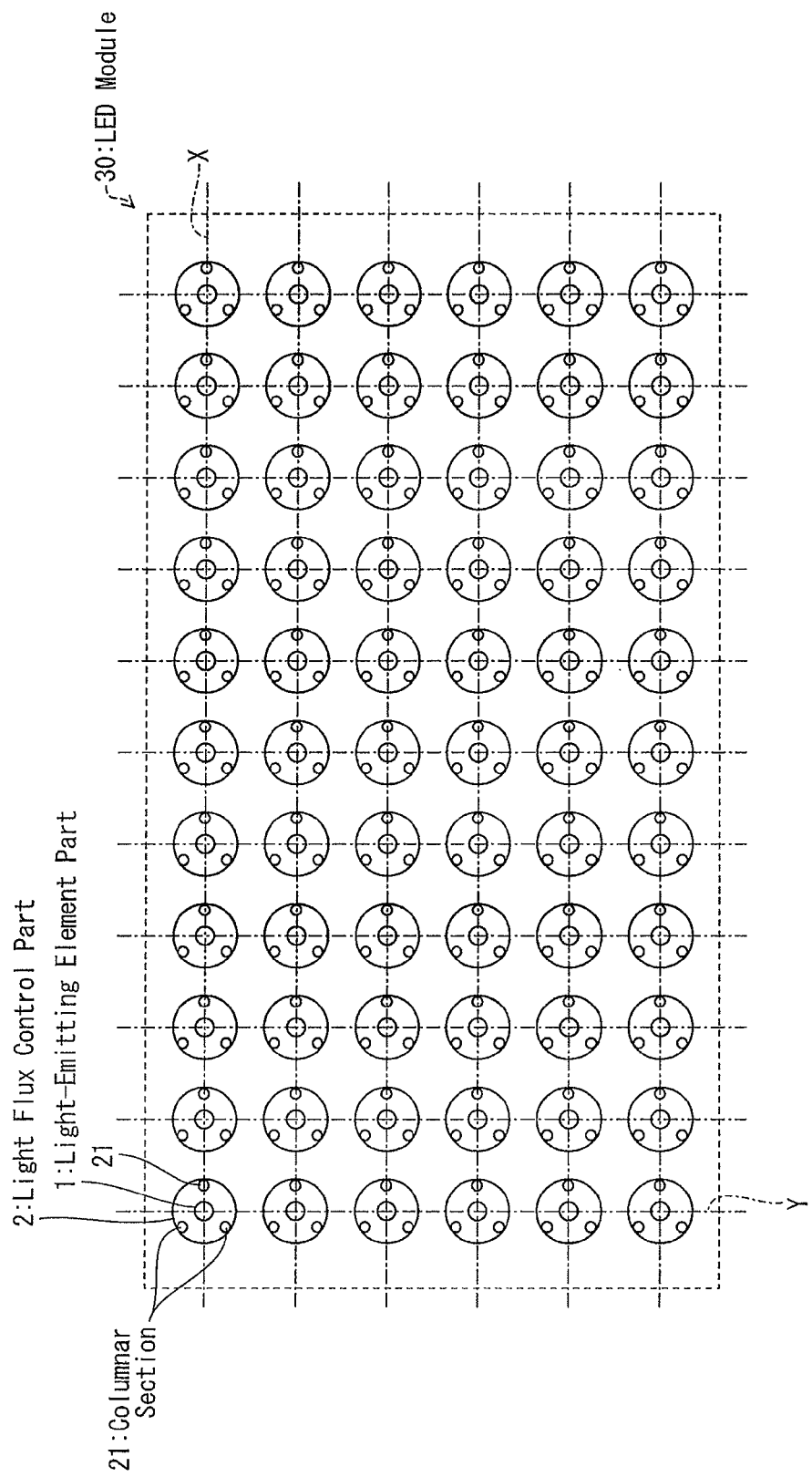

FIG. 7 is a plane view showing the light-emitting element module shown in FIG. 2 provided in a two-dimensional manner.

Figure 8:
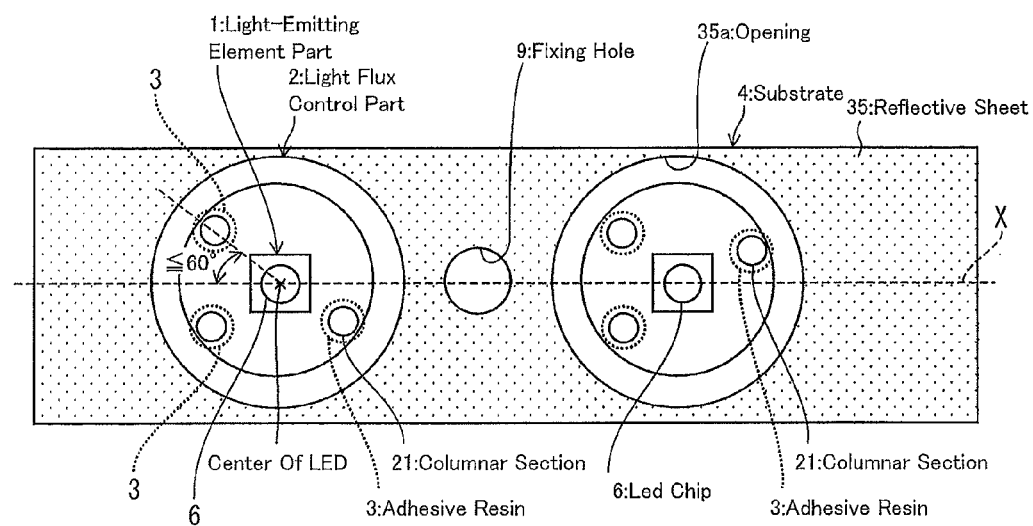

FIG. 8 is a top view showing another example of the light-emitting element module shown in FIG. 1 when it is seen from above.

Figure 9:
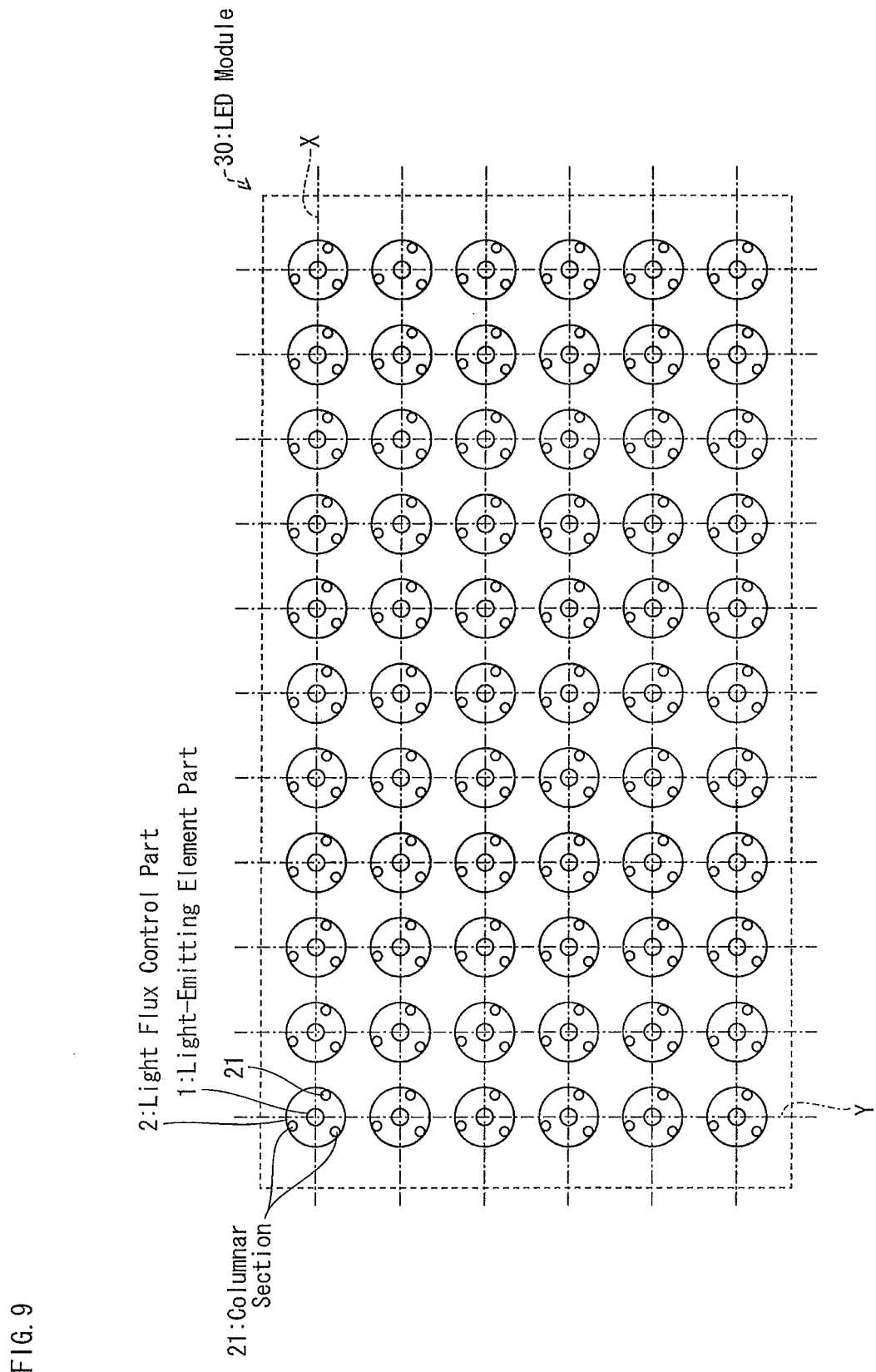

FIG. 9 is a plane view showing the light-emitting element module shown in FIG. 8 provided in a two-dimensional manner.

Figure 10:
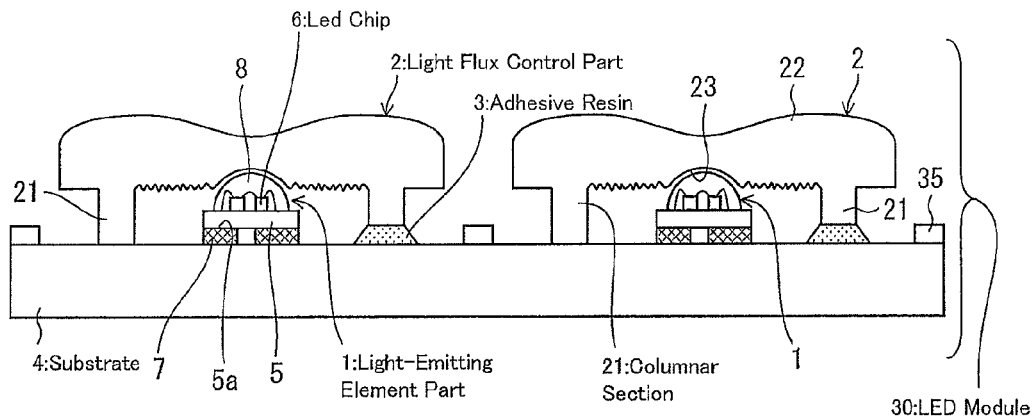

FIG. 10 is a cross sectional view schematically showing a light-emitting element module in accordance with another embodiment of the present invention.

Figure 11:
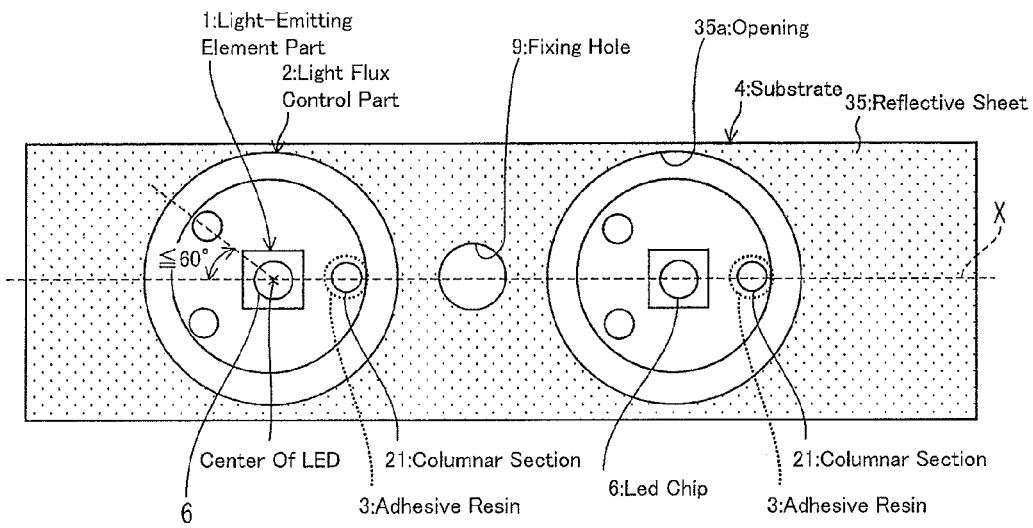

FIG. 11 is a top view showing the light-emitting element module shown in FIG. 10 when it is seen from above.

Figure 12:
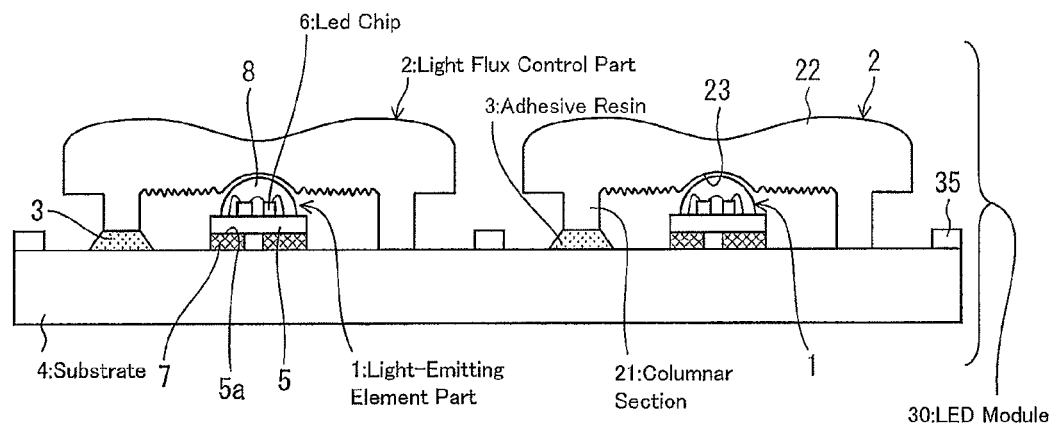

FIG. 12 is a cross sectional view schematically showing a light-emitting element module in accordance with still another embodiment of the present invention.

Figure 13:
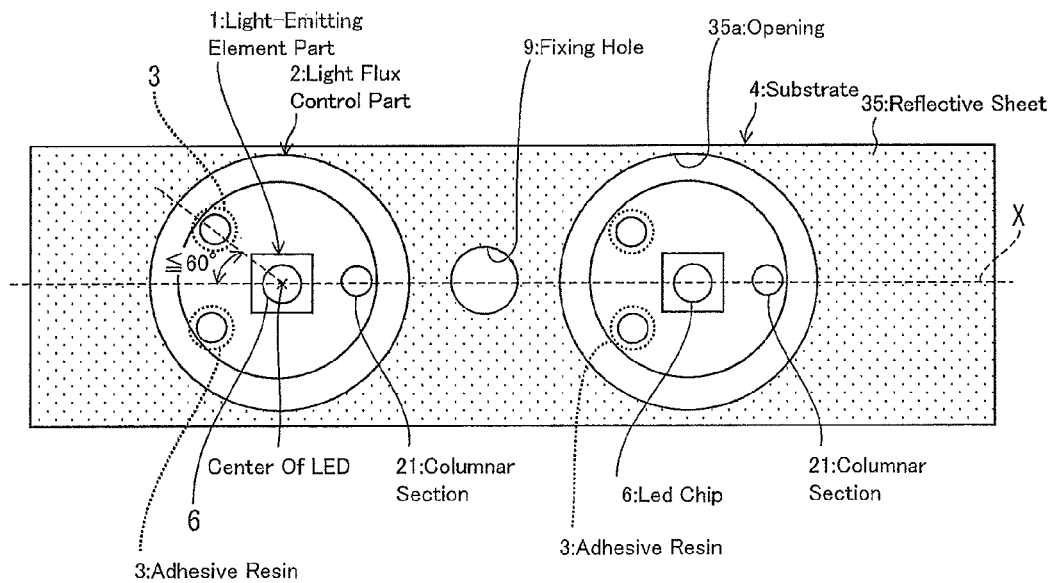

FIG. 13 is a top view showing the light-emitting element module shown in FIG. 12 when it is seen from above.

Figure 14:
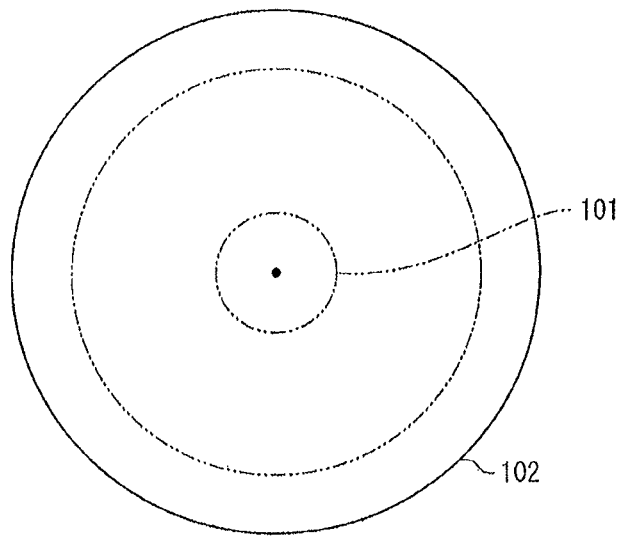
Figure 14:
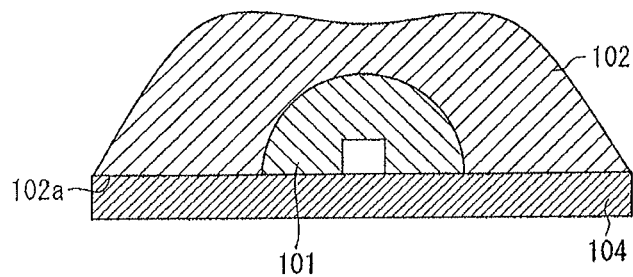
Figure 14:
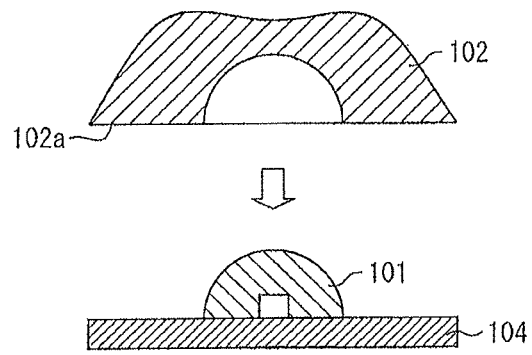

FIG. 14(a) is a plane view showing a conventional light-emitting device (light-emitting element module).

FIG. 14(b) is a cross sectional view showing the light-emitting device shown in FIG. 14(a).

FIG. 14(c) is an exploded cross sectional view showing the conventional light-emitting device shown in FIG. 14(b).

Figure 15:
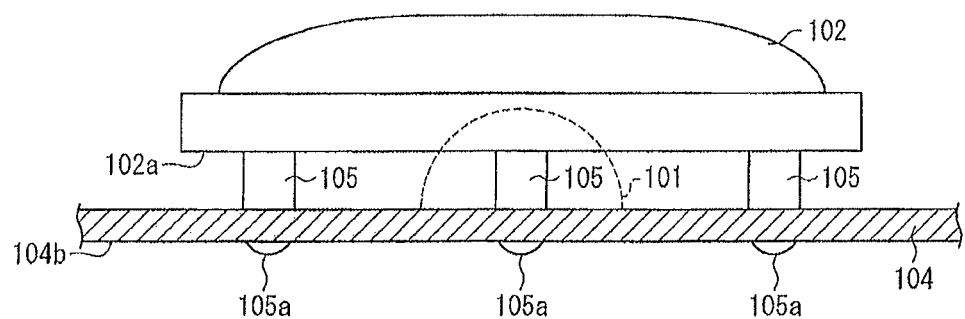
Figure 15:
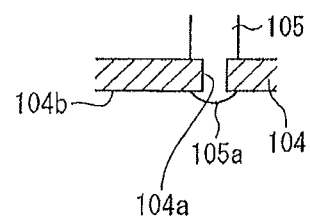

FIG. 15(a) is a view showing another conventional light-emitting device (light-emitting element module).

FIG. 15(b) is an enlarged view showing an enlarged part of the light-emitting device shown in FIG. 15(a).

DETAILED DESCRIPTION OF THE INVENTION

The following explains one embodiment of the present invention. In Embodiment 1, an explanation is made as to a case where a surface light-emitting unit of the present invention is a light emitting element module (hereinafter LED module) and a display device of the present invention is a liquid crystal display device employing the LED module as a backlight.

FIG. 1 is a cross sectional view showing an LED module 30 in accordance with the present embodiment.

As shown in FIG. 1, the LED module 30 includes a substrate (fixing substrate) 4, a plurality of light-emitting element parts 1 (light-emitting element) mounted on the substrate, and a plurality of light flux control parts (light flux control members) 2 mounted on the substrate. The light-emitting element parts 1 are LED parts on which LED elements are mounted, and the light flux control parts 2 are resin lenses for controlling the angle of light emitted from the light-emitting element parts 1.

Each of the light-emitting element parts 1 is designed such that a plurality of LED chips 6 are mounted on a part substrate 5 such as ceramics. Each LED 6 is electrically connected with a wiring layer of the part substrate 5 via a wire 10 etc., and further connected with the substrate 4 via (i) a back surface electrode 5a on the back surface of the part substrate 5 which surface is opposite to the surface where the LED chip 6 is mounted and (ii) a connecting member 7 made of solder etc.

Furthermore, on the LED chip 6 of the light-emitting element part 1, sealing resin 8 made of optically transparent resin such as silicone is provided. A fluorescent material is added to the sealing resin 8 if necessary.

In the present embodiment, an example of the LED chip 6 of the light-emitting element part 1 is a blue LED chip whose central wavelength is approximately 470 nm. A light-emitting element part 1 for R is obtained by adding, to the sealing resin 8, an R fluorescent material which emits red light upon irradiation with blue light. A light-emitting element part 1 for G is obtained by adding, to the sealing resin 8, a G fluorescent material which emits green light upon irradiation with blue light. A light-emitting element part 1 for B, which emits blue light, is obtained by adding no fluorescent material to the sealing resin 8. Thus, the light-emitting element parts 1 for R, G, and B respectively are obtained.

How to obtain the light-emitting element parts 1 for R, G, and B are not limited to the above case, and they may be obtained from another combination of fluorescent materials. Alternatively, instead of using only the blue LED chip for the LED chip 6 and differentiating colors using fluorescent materials, the light-emitting element parts 1 for R, G, and B may be obtained by combining LED chips having their emission peaks at wavelength bands of blue, red, green etc., respectively.

Alternatively, a combination of a blue LED chip and a yellow fluorescent material or a combination of a blue LED chip and a red fluorescent material and a green fluorescent material may be used to generate white emission.

Furthermore, instead of providing a plurality of low-output LED chips, one high-output LED chip may be provided.

The light flux control part 2 is made of transparent resin. Examples of the transparent resin include acrylic resin, polycarbonate resin, methacrylic resin, styrene resin, and epoxy resin.

The light flux control part 2 is designed to serve as a lens, particularly a diffusing lens. The light flux control part 2 includes an light flux control section 22 serving as a lens part, columnar sections (support members, columnar members) 21 for supporting the light flux control section 22, and a concave section 23 for securing a space into which the light-emitting element part 1 is inserted. The light flux control part 2 is molded integrally through injection molding etc. using a mold. Alternatively, the light flux control part 2 may be molded in such a manner that individual parts are molded separately and then are combined together to form the light flux control part 2.

The shapes of the light flux control section 22 and the concave section 23 are optically designed through simulation etc. in advance in such a manner that light from the light-emitting element part 1 can be obtained as efficiently as possible and is diffused in a predetermined light flux distribution. An example of the shapes is an aspherical one.

In order that the light flux control part 2 controls light from the light-emitting element part 1 in a predetermined distribution, it is desirable to mount the light flux control part 2 on the light-emitting element part 1 with high precision by use of the columnar sections 21. In particular, since the optical axis of the light-emitting element pat 1 is important and the light-emitting element part 1 is required to be horizontal, the number of the columnar sections 21 is three or more. In the present embodiment, an explanation is made as to a case where the number of the columnar sections 21 is three.

The light flux control part 2 is fixed to the substrate 4 in such a manner that each of the three columnar sections 21 is attached via the adhesive resin 3 to a fixing surface of the substrate 4 on which fixing surface the light emitting element part 1 is fixed. As described above, it is preferable to fix the light flux control part 2 to the substrate 4 where the light-emitting element part 1 is mounted, because such fixing does not cause misalignment of the optical axis. In a case where the LED module 30 is arranged on a metal plate (e.g. chassis of an electronic apparatus), although the light flux control part 2 may be directly fixed to the metal plate, the relative positional relationship between the metal plate and the substrate 4 in an end product may change in a long use. Accordingly, in order that a relative positional misalignment resulting from fixing the light-emitting element part 1 and the light flux control part 2 to different members does not cause the misalignment of the optical axis, it is preferable that the light-emitting element part 1 and the light flux control part 2 are mounted on the common base (substrate 4).

Here, the light flux control section 22 is fixed via the columnar sections 21 above a fixing surface of the substrate 4 on which fixing surface the light-emitting element part 1 is fixed. Consequently, an appropriate gap corresponding to the height of the columnar sections 21 is provided around the light-emitting element part 1 fixed onto the substrate 4. Consequently, heat resulting from emission by the light-emitting element part 1 can be released through the gap, so that luminance does not drop due to worsened heat release from the light-emitting element part 1.

In addition, since the light flux control section 22 is fixed via the columnar sections 21 above the fixing surface (front surface) of the substrate 4 on which surface the light-emitting element part 1 is fixed, the opposite surface (back surface) of the substrate 4 has no protrusions derived from the columnar sections 21 and is flat.

Consequently, when the substrate 4 is fixed to, for example, a chassis constituting a housing of an electronic apparatus, the back surface of the substrate 4 can be closely attached to the chassis, so that the light-emitting element part 1 can be kept parallel. Consequently, luminance unevenness is reduced.

Furthermore, since the substrate 4 is closely attached to the chassis, heat from the light-emitting element part 1 can be released via the chassis. Consequently, drop in luminance due to insufficient heat release of the light-emitting element part 1 can be further subdued.

Consequently, it is unnecessary to increase power supply or separately provide an optical sheet for increasing luminance in order to cover the drop in luminance of the light-emitting element part 1.

The height of the columnar sections 21 is not particularly limited as long as the height secures a gap between the light flux control section 22 and the substrate 4 which gap allows releasing heat from the light-emitting element part 1.

In a case where the LED module 30 is used as a product in a liquid crystal TV or lighting equipment, although the substrate 4 and the light flux control part 2 are fixed to each other, increase in temperature resulting from heat release from the light-emitting element part 1 and other parts while a display device operates and drop in temperature when the display device stops make the substrate 4 and the light flux control part 2 expand differently because the substrate 4 and the light flux control part 2 have different thermal expansion coefficients. This may cause stress between the substrate 4 and the light flux control part 2, resulting in their breakage. In order to prevent such breakage, it is desirable that the columnar sections 21 are designed to have a width that allows the columnar sections 21 to be deformed to disperse the stress. However, if the width is too small, there is a possibility that the columnar sections 21 cannot bear the stress and break. Accordingly, it is necessary to determine the optimal value in order to meet both of release of the stress and securing of strength.

As for the size and shape of the columnar sections 21, the optimal cross sectional shape varies depending on the shape and size of the light flux control part 2 and the position of the columnar sections 21. Examples of the cross sectional shape of the columnar sections 21 include a circle, an ellipse, a triangle, a square, an oblong, and a polygon.

In order to fix the light flux control part 2 to the substrate 4 and define the fixing surface as described above, at least three columnar sections 21 are necessary. For example, FIG. 2 shows an example where three columnar sections 21 are provided.

The columnar section 21 is a member having a cylindrical shape, and its diameter is set to 1.8 mm for example. The light flux control part 2 has an external diameter of approximately 19 mm for example, and is covered with a reflective sheet 35 having an opening 35a with a diameter of approximately 23 mm. The reflective sheet 35 and the substrate 4 have a fixing hole 9.

It is preferable that in a plane view of the substrate 4 with the light-emitting element part 1 as the center of an LED as shown in FIG. 2, the columnar sections 21 are fixedly positioned in such a manner as to form an angle of 60° or less with respect to a long side direction of the substrate 4 which direction passes through the center of an LED (i.e. with respect to a straight line X passing through the centers of LEDs of adjacent light-emitting element parts 1).

As described above, by positioning the columnar sections 21 in such a manner as to form an angle of 60° or less with respect to the long side direction of the substrate, it is possible to provide wires on the substrate 4 in such a manner that the wires are out of a region where the columnar sections 21 are positioned. This allows narrowing the width of the substrate 4 (length of the substrate 4 in a short side direction). In this case, the area of the substrate 4 can be reduced, so that manufacture costs can be reduced. Since the regions where the columnar sections 21 are attached are concentrated in an axis direction of the substrate 4 which is along the long side direction thereof, there may occur optical absorption by the adhesive resin 3. This can be solved by using, as the adhesive resin 3, resin whose color exhibits a less amount of optical absorption at a visible region than black like the case of the light flux control part 2 etc. In order to reduce optical absorption of the adhesive resin 3 as small as possible, the adhesive resin 3 is preferably white one or transparent one.

Means for eliminating unevenness or drop in luminance resulting from the columnar sections 21 will be detailed later.

There may occur optical absorption at the fixing surface of the substrate 4 where the light-emitting element part 1 is fixed, which may drop luminance. In order to prevent this, the substrate 4 is covered with the reflective sheet 35 as described above. This reduces optical absorption at the fixing surface, so that drop in luminance can be subdued. In addition to covering of the fixing surface with the reflective sheet 35, the fixing surface may be modified to have a property that reduces optical absorption. For example, a resin material having high reflectance may be applied on the fixing surface of the substrate 4 where the light-emitting element part 1 is fixed. This can also reduce optical absorption at the fixing surface of the substrate 4.

As described above, the LED module 30 is designed to subdue unevenness and drop in luminance, and therefore can exhibit even luminance at the light-emitting surface and efficiently radiate light from the light source. By using the LED module 30 as a backlight in a liquid crystal display device, it is possible to eliminate drop in image quality resulting from the unevenness in luminance, in particular, drop in image quality caused when an unrelated shadow appears on a scrolled image while displaying a moving image.

With reference to FIG. 3, the following explains a liquid crystal display device using the LED module 30 as a backlight.

FIG. 3 is a cross sectional view schematically showing a liquid crystal module 31 serving as a liquid crystal display device.

As shown in FIG. 3, the liquid crystal module 31 includes a backlight chassis 34 made of resin or metal such as aluminum and the LED module 30 provided on the backlight chassis 34. The LED module 30 is fixed to the backlight chassis 34 via a fixing part 36 made of white resin and the fixing hole 9 which penetrates the substrate 4 and the reflective sheet 35.

Above the LED module 30, there are provided a support section (not shown) around the backlight chassis 34, and an optical sheet etc. 32 positioned by a support pin 37 to be away at a predetermined distance from the backlight chassis 34. The optical sheet etc. 32 includes, for example, a diffusion plate, a microlens sheet, and a microlens sheet which are positioned in this order from the side closer to the LED module 30. A liquid crystal panel 33 is positioned on the optical sheet etc. 32. Thus, the liquid crystal module 31 is provided.

With reference to (a) to (c) of FIG. 4 and (a) to (c) of FIG. 5, the following explains the result of measurement of luminance unevenness at the liquid crystal module 31.

(a) to (c) of FIG. 4 show the result of measurement of luminance unevenness in a case where the adhesive resin 3 used for the columnar sections 21 which fix the light flux control part 2 to the substrate 4 in the LED module 30 is resin which exhibits optical absorption at a visible light region.

(a) to (c) of FIG. 5 show the result of measurement of luminance unevenness in a case where the adhesive resin 3 used for the columnar sections 21 which fix the light flux control part 2 to the substrate 4 in the LED module 30 is transparent or white resin which exhibits no optical absorption at a visible light region.

That is, (a) to (c) of FIG. 4 show the result of measurement of optical unevenness in a case where the adhesive resin 3 in the liquid crystal module 31 shown in FIG. 3 is general epoxy resin containing carbon black which exhibits optical absorption at a visible light region, and (a) to (c) of FIG. 5 show the result of measurement of optical unevenness in a case where the adhesive resin 3 in the liquid crystal module 31 shown in FIG. 3 is white resin which exhibits no optical absorption at a visible light region. The measurement of optical unevenness herein indicates measurement of luminance distribution in the liquid crystal module 31.

The measurement of luminance distribution was made with CA2000 manufactured by KONICA MINOLTA. The liquid crystal module 31 used herein was designed such that the size of the liquid crystal panel 33 was 40 inches and the number of the light-emitting element parts 1 was 119. The measurement was made in such a manner that the liquid crystal panel 33 displayed white and all of the light-emitting element parts 1 emitted light.

The result of the measurement consists of a two-dimensional luminance distribution map, a luminance cross section in an x-direction ((c) of FIG. 4, (c) of FIG. 5), and a luminance cross section in a y-direction ((b) of FIG. 4, (b) of FIG. 5). These luminance cross sections are cross sections of the center of the liquid crystal module 31 (portion where the light-emitting element part 1 is positioned). The result of the measurement shows that in a case where the adhesive resin 3 is resin which exhibits optical absorption at a visible light region, the adhesive resin 3 absorbs returning light etc. from the diffusion plate so that there appear regions with low luminance that correspond to adhesive regions as shown in (a) to (c) of FIG. 4. This causes unevenness in the luminance cross section. Because of such luminance unevenness, there appears an unrelated shadow in a scrolled image, and so the liquid crystal module cannot be used for displaying a moving image.

In contrast thereto, the result of the measurement shows that in a case where the adhesive resin 3 is resin exhibiting no optical absorption at a visible light region, there appears no luminance unevenness as shown in (a) to (c) of FIG. 5. Accordingly, the liquid crystal module 31 can be preferably used for displaying a moving image.

As described above, by designing the LED module 30 such that there is provided a gap between the light flux control section 22 and the substrate 4 where the light-emitting element part 1 is fixed and the surface of the substrate 4 opposite to the fixing surface where the light-emitting element part 1 is fixed is flat, it is possible to prevent the heat release property of the light-emitting element part 1 from being worsened. Thus, it is possible to realize an inexpensive surface light-emitting unit which exhibits no luminance unevenness at a light-emitting surface.

A possible cause for luminance unevenness in the LED module 30 included in the liquid crystal module 31 is patterns on the surface of the substrate 4, such as a wiring pattern.

With reference to (a) and (b) of FIG. 6, the following explains patterns on the surface of the substrate 4.

As shown in (a) of FIG. 6, on the surface of the substrate 4, there are provided electrode patterns 41 for supplying a power to the light-emitting element part 1 and a wiring pattern 42 connected with the electrode patterns 41. The electrode patterns 41 are connected with the back surface electrode 5a of the part substrate 5 via a connecting member 7.

A white resist is applied on the wiring pattern 42 for the purpose of insulation and increase in reflectance.

The electrode patterns 41 include an electrode pattern 41a and an electrode pattern 41b. For example, a cathode of the part substrate 5 is connected with the electrode pattern 41a and an anode of the part substrate 5 is connected with the electrode pattern 41b so that both ends of the part substrate 5 are connected with an LED driving circuit (not shown) in order that the light-emitting element part 1 emits light.

When fixing the light flux control part 2 to the substrate 4 in the LED module 30, there is a case where recognition patterns 43 are provided on the surface of the substrate 4 so as to be positioned at portions where the columnar sections 21 are fixed as shown in (a) of FIG. 6. In most cases, the recognition patterns 43 have black color so as to facilitate recognition, but black color may cause optical loss. When the columnar sections 21 are fixed to the substrate 4 via white resin as the adhesive resin 3, the adhesive resin 3 covers the recognition patterns 43, so that optical loss is not caused. Alternatively, instead of the recognition patterns 43 having black color, the recognition patterns 43 may contain a fluorescent material excited by light whose wavelength is shorter than that of visible light or may contain a light-diffusing material. In this case, when fixing the columnar sections 21 to the substrate 4, radiating light with a predetermined short wavelength or radiating light in a predetermined angle allows recognizing the recognition patterns. Since the recognition patterns in this case do not cause optical loss, the adhesive resin 3 may be transparent resin instead of white resin.

In the case where the adhesive resin 3 is white resin, application of the adhesive resin 3 on the recognition patterns 43 whose color is other than white changes the color of the recognition patterns 43. Consequently, operation mistakes such as failure to apply the adhesive resin 3 can be easily noticed.

As the thickness of the adhesive resin 3 between the columnar sections 21 and the substrate 4 is smaller, accuracy in height position of the light flux control part 2 increases. However, as the thickness of the adhesive resin 3 is smaller, the effect of the adhesive resin 3's masking of the recognition patterns 43 is weaker, so that the color of the recognition patterns 43 is more likely to be seen through the adhesive resin 3.

As such, recognition patterns 44 having a ring shape as shown in (b) of FIG. 6 may be employed. The recognition patterns 44 allow increasing the effect of the adhesive resin 3's masking.

Consequently, the adhesive resin between the molded member and the fixing substrate can be thinner, so that accuracy in height position of the light flux control member can be increased.

Consequently, the light flux control member can be more parallel, so that the distance between the light-emitting surface of the surface light-emitting unit and the light flux control member can be constant. As a result, luminance at the light-emitting surface can be even.

Appropriately setting the shape of the columnar sections 21 constituting the light flux control part 2, appropriately setting the height (length) between the fixing surface of the substrate 4 where the columnar sections 21 are fixed and a counter surface of the substrate 4 which surface faces the light flux control section 22, appropriately setting the size (diameter) of the columnar sections 21, and appropriately setting the position of the columnar sections 21 are very important in terms of subduing drop in luminance and unevenness in luminance. That is, it is necessary to subdue drop in luminance resulting from inappropriate size (height (length), width (diameter)) of the columnar sections 21 and to subdue unevenness in luminance resulting from the positional relationship among the columnar sections 21.

Normally, a backlight for liquid crystal is provided at the back side of a liquid crystal panel. Accordingly, if a liquid crystal display device as a whole is intended to be thinner, it is necessary to make the liquid crystal backlight thinner.

Herein, making the LED module 30 included in the liquid crystal backlight thinner is essential for making the liquid crystal backlight thinner.

For making the LED module 30 thinner, the height of the columnar sections 21 of the light flux control part 2 is an important factor. Furthermore, in consideration of the strength of the LED module 30, not only the height of the columnar sections 21 but also appropriately designing the cross section of the columnar sections 21 is important factors.

For example, it is desirable to design the height (length) of the columnar sections 21 in such a manner that the light flux control part 2 is positioned as closely to the light-emitting element part 1 as possible provided that the light flux control part 2 does not touch the light-emitting element part 1 and that optical simulation exhibits a predetermined dispersion.

If the columnar sections 21 and the adhesive resin 3 of the light flux control section 22 surround the light-emitting element part 1 and consequently block air flow around the light-emitting element part 1 and prevent air cooling of the light-emitting element part 1, there may be a demerit of drop in reliability of the light-emitting element part 1, such as drop in luminance of the LED chip 6. For this reason, it is desirable that the volumes of the columnar sections 21 and the adhesive resin 3 are as small as possible.

In consideration of the above and in consideration of easiness in producing the columnar sections 21 as support sections, in the present embodiment, the columnar sections 21 are columns whose diameter is 1.8 mm and whose height (length) is 1.1 mm. As the length of the columnar sections 21 is longer, reflective light inside the backlight is more likely to enter the light flux control section 22 (lens) and thus reduces light intensity, resulting in drop in luminance. In order to deal with this problem, it is necessary to appropriately set the length of the columnar sections 21. It should be noted that the length and the width of the columnar sections 21 mentioned above are merely examples and the columnar sections 21 are not limited to these examples.

By setting the width and the length of the columnar sections 21 as above, it is possible to avoid occurrence of blocking of air flow to the light-emitting element part 1, so that air cooling of the LED chip 6 is not prevented. Consequently, luminance of the LED chip 6 does not drop, so that it is possible to subdue drop in luminance of the LED module 30.

The following explains prevention of drop in luminance resulting from the positional relationship among the columnar sections 21.

Since the columnar sections 21 are different in structure from other components in the light flux control part 2, there occurs an optical difference between the columnar sections 21 and other components. The optical influence in this case is such that light flux is larger and stronger as the light flux is closer to the light-emitting element part 1 which is a light source. For this reason, it is desirable that the columnar sections 21 are positioned far from the light-emitting element part 1 which is the center of the LED module 30. On the other hand, if the distance between the columnar sections 21 is larger, a difference in expansion at the time of temperature change between the columnar sections 21 is larger, causing a larger stress and drop in reliability. In consideration of the above, it is desirable that the columnar sections 21 are positioned as far as possible from the light-emitting element part 1 provided that the columnar sections 21 remain within a range where reliability does not drop and there is no optical influence.

However, even if the columnar sections 21 are positioned within a range where there is as little optical influence as possible, it is difficult to put the columnar sections 21 in a range where there is no optical influence on the columnar sections 21, because balance with strength and a request for downsizing the light flux control part 2 must be considered.

Unevenness in luminance resulting from the optical influence of the light-emitting element part 1 and the light flux control part 2 can be dealt with by appropriately setting the light flux control part 2. In a case where the LED module 30 is used as a backlight or lighting equipment, in order to reduce optical unevenness, an optical member such as a diffusion plate for making light flux even is provided above the LED module 30 on which a plurality of light-emitting element parts 1 and a plurality of light flux control parts 2 are provided. In this case, light comes from other light-emitting element part 1 via the light flux control part 2 and is reflected by the optical member to enter the light emitting-element part 1 and the light flux control part 2 as a light flux component. Such a light flux component is not a negligible factor.

Accordingly, in a case where the columnar sections 21 of the light flux control part 2 and the adhesive resin 3 are made of members different in optical properties from surrounding members, there appear portions with lower luminance in specific directions from the columnar sections 21 and the adhesive resin 3 fixing the columnar sections 21, so that there appear optically uneven portions. In order to deal with this problem, in the present invention, the adhesive resin 3 via which the columnar sections 21 of the light flux control section 22 are fixed to the substrate 4 is white or transparent resin which has the same optical absorption as that of the light flux control part 2 etc. and exhibits a little amount of optical absorption at a visible light region.

Consequently, it is possible to eliminate portions with lower luminance in specific directions from the adhesive resin 3 fixing the columnar sections 21, so that there appear no optically uneven portions. Accordingly, it is possible to eliminate luminance unevenness at the light-emitting surface of the LED module 30.

An appropriate range of positions of the columnar sections 21 has been explained above with reference to FIG. 2. Furthermore, there is a case where columnar sections 21 of adjacent light flux control parts 2 cast shadows, which are combined to cause unevenness in luminance.

For example, in FIG. 2, on the line X passing through the centers of LEDs of adjacent light-emitting element parts 1, one of three columnar sections 21 of each light flux control part 2 is positioned.

FIG. 7 is a view showing the LED module 3 in which the light-emitting element parts 1 shown in FIG. 2 are provided two-dimensionally.

In FIG. 7, lines X and Y pass through the center of the LED of each light-emitting element part 1. The lines X and Y cross each other at a right angle.

Consequently, in the LED module 30 shown in FIG. 7, each light flux control part 2 includes three columnar sections 21, and one of the three columnar sections 21 is provided in such a manner that its center is positioned on the lateral line X joining the centers of adjacent light-emitting element parts 1, and remaining two of the three columnar sections 21 are provided in such a manner that their centers are not positioned on the vertical line Y joining the centers of adjacent light-emitting element parts 1. In this case, streaks of luminance unevenness appeared only in the lateral direction (x-direction), and not in the vertical direction (y-direction). This is because the columnar sections 21 block light from the light-emitting element part 1 to cast shadows, which are aligned on the line joining the light-emitting element parts 1 adjacent in a lateral direction and are emphasized, but are not aligned on the line joining the light-emitting element parts 1 adjacent in a vertical direction.

FIG. 7 shows an example in which the columnar sections 21 are provided in such a manner as to be positioned on the lateral line X and not on the vertical line Y. However, in a case where the columnar sections 21 are provided in such a manner as to be positioned not on the lateral line X but on the vertical line Y, streaks of luminance unevenness appear only in the vertical direction (y-direction), and not in the lateral direction (x-direction).

FIG. 8 is a view showing an example where the columnar sections 21 shown in FIG. 2 which are positioned on the line X are rearranged not to be positioned on the line X.

In FIG. 8, the three columnar sections 21 of each light flux control part 2 are provided in such a manner that none of the three columnar sections 21 are positioned on the line X passing through the centers of LEDs of adjacent light-emitting element parts 1.

FIG. 9 is a view showing the LED module 30 in which the light-emitting element parts 1 shown in FIG. 8 are provided two-dimensionally.

In FIG. 9 as well as in FIG. 7, lines X and Y pass through the center of the LED of each light-emitting element part 1. The lines X and Y cross each other at a right angle.

In the LED module 30 shown in FIG. 9, the columnar sections 21 of each light flux control section 2 are provided in such a manner that centers of all the columnar sections 21 of each light flux control section 2 are not positioned on vertical and lateral lines (lines X and Y) joining the centers of adjacent light-emitting element parts 1. In this case, streaks of luminance unevenness did not appear both in the vertical and lateral directions. This is because the columnar sections 21 block light from the light-emitting element part 1 to cast shadows, but the shadows do not aligned on the vertical line Y or the lateral line X joining adjacent light-emitting element parts 1.

In the LED module 30 shown in FIG. 9, all of the light flux control parts 2 exhibit the same positional relationship among the columnar sections 21. However, the present invention is not limited to this, and the positional relationship among the columnar sections 21 in one light flux control part 2 may vary depending on whether the light flux control part 2 is on an odd column or an even column, or the positional relationship among the columnar sections 21 in one light flux control part 2 may be completely random. In the latter case, shadows of the columnar sections 21 overlap each other at smaller areas, so that streaks of luminance unevenness is further subdued.

In a case of a surface light-emitting unit as shown in FIGS. 7 and 9, it is preferable to arrange the light-emitting element parts 1 in a square manner in the LED module 30 in order to make in-plane luminance even. When the light-emitting element part 1 is arranged in a square manner, mutual influences between adjacent light-emitting element parts 1 exist not only in vertical and lateral directions but also in oblique directions (diagonal directions). Accordingly, it is necessary to provide the columnar sections 21 in such a manner that the columnar sections 21 are not positioned on lines passing through the light-emitting element parts 1 adjacent in diagonal directions as well as the columnar sections 21 are not positioned on the lines X and Y. This arrangement allows eliminating mutual influences between the light-emitting element parts 1 which are adjacent in the diagonal directions as well as mutual influences between the light-emitting element parts 1 which are adjacent in the vertical and lateral directions, so that it is possible to greatly reduce unevenness in luminance resulting from the mutual influences between the adjacent light-emitting element parts 1.

In the present Embodiment 1, an explanation was made as to a case where all of the columnar sections 21 are adhered and fixed to the substrate 2 via the adhesive resin 3. However, all of the columnar sections 21 are not necessarily adhered and fixed to the substrate 2 via the adhesive resin 3, and it is only required that the optical flux control part 2 is fixed to the substrate 4. Accordingly, the number of the columnar sections 21 which are adhered and fixed is not particularly limited.

In Embodiment 2 below, explanations will be made as to an example in which only one of the three columnar sections 21 of each light flux control part 2 is adhered and fixed to the substrate 4 via the adhesive resin 3 and an example in which two of the three columnar sections 21 of each light flux control part 2 are adhered and fixed to the substrate 4 via the adhesive resin 3.

The following explains another embodiment of the present invention with reference to FIGS. 10 to 13. An LED module 30 in accordance with the present embodiment is the same as that in accordance with the Embodiment 1 in terms of its basic structure, and therefore components having the same functions are given the same reference signs and detailed explanations thereof are omitted here.

FIG. 10 is a cross sectional view showing an LED module 30 obtained by modifying the LED module 30 shown in FIG. 1 in accordance with the Embodiment 1 to partially exclude the adhesive resin 3. FIG. 11 is a plane view showing the LED module 30 shown in FIG. 10 seen from the above.

Here, as shown in FIG. 11, there is shown an example in which out of the three columnar sections 21 of each light flux control part 2, two columnar sections 21 at the left side of the drawing are not adhered and fixed to the substrate 4 via the adhesive resin 3. That is, there is shown an example in which only one of the three columnar sections 21 is adhered and fixed to the substrate 4 via the adhesive resin 3. The columnar section 21 to be adhered and fixed may be any of the three columnar sections 21.

As explained in the Embodiment 1, even when the adhesive resin 3 is made of white resin or transparent resin which exhibits a small amount of optical absorption at a visible light region like the light flux control part 2 etc. in order to reduce luminance unevenness resulting from the adhesive resin 3, it is difficult to completely eliminate the influence of the adhesive resin 3 because the adhesive resin 3 still exists at a region where the columnar sections 21 are adhered and fixed.

In order to deal with this, in the above example, only one of the three columnar sections 21 for supporting the light flux control part 2 is adhered and fixed to the substrate 4 via the adhesive resin 3, so that the influence of the adhesive resin 3 can be reduced compared with the case where all of the columnar sections 21 are adhered and fixed to the substrate 4 via the adhesive resin 3. Accordingly, it is possible to further reduce luminance unevenness resulting from the adhesive resin 3.

Furthermore, reducing the number of portions where the adhesive resin 3 is used allows reducing the influence of the adhesive resin 3 as described above. Accordingly, the adhesive resin 3 is not required to be made of white resin or transparent resin which exhibits a small amount of optical absorption at a visible light region as above. That is, the material of the adhesive resin 3 can be selected more freely.

In view of the above, in the case where only one of the three columnar sections 21 for supporting the light flux control part 2 is adhered and fixed to the substrate 4 via the adhesive resin 3, it is possible to further reduce luminance unevenness resulting from the adhesive resin 3 compared with the case where all of the three columnar sections 21 are adhered and fixed to the substrate 4. Accordingly, the above effect can be yielded without specifically limiting the material of the adhesive resin 3. However, in order to further reduce luminance unevenness, the material of the adhesive resin 3 is preferably white resin or transparent resin which exhibits a small amount of optical absorption at a visible light region.

Similarly with the Embodiment 1, in the present embodiment, it is preferable that the LED module 30 shown in FIG. 11 is designed such that none of the three columnar sections 21 of each light flux control part 2 are positioned to be on the line X passing through the centers of LEDs of adjacent light-emitting parts 1 in order to eliminate the influence of in-plane luminance unevenness resulting from the shadows of the columnar sections 21, as in the case of the LED module 30 shown in FIG. 8 in accordance with the Embodiment 1.

Although the above example has various merits as above resulting from the configuration that the light flux control part 2 is fixed to the substrate 4 via only one of the three columnar sections 21, the above example also has demerits such as low adhesive strength and unstable fixation.

In order to deal with this, one possible example is such that the light flux control part 2 is fixed to the substrate 4 via two of the three columnar sections 21.

FIG. 12 is a cross sectional view showing another example of an LED module 30 obtained by modifying the LED module 30 shown in FIG. 1 in accordance with the Embodiment 1 to partially exclude the adhesive resin 3. FIG. 13 is a plane view showing the LED module 30 shown in FIG. 12 seen from the above.

Here, as shown in FIG. 13, there is shown an example in which only one of the three columnar sections 21 of each light flux control part 2 is not adhered and fixed to the substrate 4 via the adhesive resin 3. That is, there is shown an example in which two of the three columnar sections 21 are adhered and fixed to the substrate 4 via the adhesive resin 3. The two columnar sections 21 to be adhered and fixed may be any combinations of the three columnar sections 21.

In the above example, two of the three columnar sections 21 for supporting the light flux control part 2 are adhered and fixed to the substrate 4 via the adhesive resin 3. This configuration allows increasing adhesive strength and securing more stable fixation compared with the example in which only one of the three columnar sections 21 is adhered and fixed as described above.

In the case where only one of the three columnar sections 21 for supporting the light flux control part 2 is adhered and fixed, any of the three columnar sections 21 may be selected and adhered and fixed. However, in the case where two of the three columnar sections 21 are adhered and fixed, where to position the two columnar sections 21 to be adhered and fixed is important.

In the present embodiment, as shown in FIG. 13, there is shown an example in which two columnar sections 21 positioned substantially parallel with each other in a short side direction not in a long side direction of the strip-shaped (strip-like) substrate 4 are adhered and fixed as shown in FIG. 13. This example is intended to avoid decrease in adhesive strength of the light flux control part 2 which is caused by deformation/distortion of the strip-shaped substrate 4 resulting from thermal expansion of the substrate 4, or to avoid breakage of the light flux control part 2 which is caused by propagation of the deformation/distortion of the substrate 4 to the light flux control part 2 via the columnar sections 21.

Similarly with the Embodiment 1, also in the present embodiment, it is necessary to consider luminance unevenness resulting from shadows of the columnar sections 21. That is, in the case where one of the three columnar sections 21 of each light flux control part 2 is positioned on the line X passing through the centers of the LEDs of adjacent light-emitting element parts 1 as shown in FIGS. 11 and 13, there is a possibility that streaks of luminance unevenness appear in a lateral direction parallel to the line X. This is because, as explained in the Embodiment 1, the columnar sections 21 on the line X block light from the light-emitting element part 1 to cast shadows, which are aligned on the line joining the light-emitting element parts 1 adjacent in a lateral direction and are emphasized.

In order to avoid this phenomenon, the columnar sections 21 of each light-emitting element part 1 are provided not to be positioned on the line X as shown in FIG. 8 in accordance with the Embodiment 1.

Accordingly, in the present embodiment, by positioning the columnar sections 21 as shown in FIG. 8 and reducing the number of portions where the light flux control part 2 is adhered and fixed to the substrate 4 via the adhesive resin 3, it is possible to further subdue luminance unevenness resulting from the columnar sections 21 and the adhesive resin 3, compared with the Embodiment 1, so that it is possible to realize a surface light-emitting unit with further even luminance compared with the Embodiment 1.

In the above embodiments, explanations were made as to examples where support members for supporting the light flux control part 2 are columnar sections 21 having a columnar shape, but the shape of the support members is not particularly limited. The support member may have a shape obtained by partially removing a ring formed integrally with a lens serving as the light flux control part 2. Alternatively, the support member may be a protrusion provided on the substrate 4 to support the light flux control part 2.

It is preferable to arrange the surface light-emitting unit of the present invention such that each of the plurality of support members is a columnar member.

With the arrangement, since each of the plurality of support members is a columnar member, a stress caused by thermal expansion of the light flux control member resulting from heat released when the light-emitting element emits light or a stress caused by thermal contraction of the light flux control member resulting from cooling of the light-emitting element when it stops emitting light can be dispersed by deformation of the columnar members. That is, by controlling the width of the columnar members, it is possible to easily control the degree of strength dispersion caused by deformation of the columnar members.

It is preferable to arrange the surface light-emitting unit of the present invention such that each of the plurality of support members is formed integrally with the light flux control member.

With the arrangement, since each of the support members is formed integrally with the light flux control member, the support members are made of a light-transmitting material which is the same as that for the light flux control member. Furthermore, since the end of the support member is adhered and fixed to the fixing substrate via the adhesive resin which exhibits a small amount of optical absorption at a visible light region, spaces around the support members and spaces around portions where the support members are fixed to the fixing substrate via the adhesive resin are not darkened, so that it is possible to further reduce luminance unevenness at the light-emitting surface of the surface light-emitting unit.

It is preferable to arrange the surface light-emitting unit of the present invention such that each of the plurality of support members is fixedly positioned in such a manner as to form an angle of 60° or less with respect to a long side direction of the fixing substrate which direction passes through a center of the fixing substrate in a plane view of the fixing substrate.

With the arrangement, the width in a short side direction of the fixing substrate to which the light flux control member is fixed can be shortened, so that the area of the fixing substrate as a whole can be reduced. Since the area of the substrate is reduced, the cost for the substrate can be reduced.

The surface light-emitting unit of the present invention is arranged such that only one of the plurality of support members is adhered and fixed to the fixing substrate via the adhesive resin.

With the arrangement, since only one of the plurality of support members is fixed to the fixing substrate via the adhesive resin, it is possible to reduce the influence of luminance unevenness resulting from the adhesive resin compared with a case where all the support members are fixed to the fixing substrate via the adhesive resin. Furthermore, when thermal distortion/deformation of the fixing substrate is propagated to the support member via the adhesive resin, since only one of the plurality of support members is fixed to the fixing substrate, thermal distortion/deformation is not propagated to other one or ones of the plurality of support members, any of the support members is not broken.

The surface light-emitting unit of the present invention is arranged such that the plurality of support members are three or more support members, only two of which are adhered and fixed to the fixing substrate via the adhesive resin.

With the arrangement, since only three of the three or more support members are fixed to the fixing substrate via the adhesive resin, it is possible to reduce the influence of luminance unevenness resulting from the adhesive resin, compared with the case where all the support members are fixed to the fixing substrate via the adhesive resin.

Furthermore, since two support members are fixed to the fixing substrate via the adhesive resin, it is possible to increase adhesive strength between the support members and the fixing substrate compared with a case where only one support member is fixed to the fixing substrate via the adhesive resin. Consequently, the light flux control member supported by these support members can be fixed to the fixing substrate further stably.

It is preferable to arrange the surface light-emitting unit of the present invention such that the fixing substrate has a strip shape, and said only two support members which are adhered and fixed to the fixing substrate via the adhesive resin are aligned in a short side direction of the fixing substrate.

In general, in a case where a fixing substrate has a strip shape, the influence of deformation/distortion resulting from thermal expansion is larger in a long side direction of the fixing substrate than in a short side direction. Consequently, the fixing substrate having a strip shape is susceptive to the influence of deformation/distortion resulting from thermal expansion in the long side direction, whereas not susceptive to the influence of deformation/distortion resulting from thermal expansion in the short side direction.

Accordingly, by fixing the two support members aligned in a short side direction of the fixing substrate via the adhesive resin as above, the support members fixed via the adhesive resin are less likely to be influenced by deformation/distortion resulting from thermal expansion. Consequently, it is possible to avoid drop in adhesive strength of the light flux control member or to avoid breakage of the light flux control member resulting from propagation of deformation/distortion of the fixing substrate to the light flux control member via portions where the fixing members are adhered and fixed to the substrate.

Here, there is a possibility of optical absorption at the fixing surface of the fixing substrate on which fixing surface the light-emitting element is fixed, resulting in drop in luminance.

In order to deal with this, it is preferable to arrange the surface light-emitting unit of the present invention such that the fixing surface of the fixing substrate on which fixing surface the light-emitting element is fixed has a property which exhibits a small amount of optical absorption at a visible light region.

Furthermore, it is preferable to arrange the surface light-emitting unit such that a reflective sheet is provided on the fixing surface of the fixing substrate on which fixing surface the light-emitting element is fixed.

Furthermore, it is preferable to arrange the surface light-emitting unit of the present invention such that a resin material with high reflectance is applied on the fixing surface of the fixing substrate on which fixing surface the light-emitting element is fixed.

With the above arrangements, it is possible to reduce optical absorption at the fixing surface of the fixing substrate on which fixing surface the light-emitting element is fixed. Accordingly, it is possible to subdue drop in luminance at the light-emitting surface.

It is preferable to arrange the surface light-emitting unit of the present invention such that recognition patterns indicative of positions on which the plurality of support members are fixed are provided on the fixing surface of the fixing substrate on which fixing surface the light-emitting element is fixed.

With the arrangement, since recognition patterns indicative of positions on which the plurality of support members are fixed are provided on the fixing surface of the fixing substrate on which fixing surface the light-emitting element is fixed, it is possible to accurately fix the support members to target positions.

Consequently, it is possible to position the light flux control member appropriately with respect to the light-emitting element, so that it is possible to eliminate misalignment of the optical axis between the light-emitting element and the light flux control member.

Consequently, drop in luminance resulting from the misalignment of the optical axis between the light-emitting element and the light flux control member can be eliminated, so that luminance unevenness at the light-emitting surface of the surface light-emitting unit can be reduced.

In a case where the recognition patterns have a color which absorbs light at a visible light region, there is a possibility that luminance drops due to the recognition patterns.

In order to deal with this, it is preferable to arrange the surface light-emitting unit of the present invention such that each of the recognition patterns has a size which allows the recognition patterns to be covered by the adhesive resin when the plurality of support members are fixed to the fixing substrate via the adhesive resin.

With the arrangement, when the plurality of support members are fixed to the fixing substrate via the adhesive resin, the recognition patterns are covered by the adhesive resin exhibiting a small amount of optical absorption at a visible light region, so that the recognition patterns are hidden. Accordingly, there is no possibility that luminance drops due to the recognition patterns.

In order to yield similar effects, the arrangements below are preferable.

It is preferable to arrange the surface light-emitting unit of the present invention such that the recognition patterns include a fluorescent material excited upon irradiation with light whose wavelength is shorter than that of visible light.

It is preferable to arrange the surface light-emitting unit of the present invention such that the recognition patterns include a light diffusing material.

By designing the color of the recognition patterns to be different from the color of the adhesive resin, application of the adhesive resin with the different color on the recognition patterns changes the color of the recognition patterns. Consequently, operation mistakes such as failure to apply the adhesive resin can be easily noticed.

By designing each of the recognition patterns to have a ring shape at a region corresponding to an end of the plurality of support members, it is possible to increase the effect of the adhesive resin's masking even if the amount of the adhesive resin to be applied is not so large.

Consequently, the adhesive resin between the support members and the fixing substrate can be thinner, so that accuracy in height position of the light flux control member can be increased.

Consequently, the light flux control member can be more parallel, so that the distance between the light-emitting surface of the surface light-emitting unit and the light flux control member can be constant. As a result, luminance at the light-emitting surface can be even.

The present invention is not limited to the description of the embodiments above, but may be altered by a skilled person within the scope of the claims. An embodiment based on a proper combination of technical means disclosed in different embodiments is encompassed in the technical scope of the present invention.

The present invention is preferably applicable to lighting equipment, a backlight of a display device etc. which requires a surface light source obtained by positioning a plurality of light-emitting elements in a two-dimensional manner.

REFERENCE SIGNS LIST

1. Light-emitting element part
2. Light flux control part
3. Adhesive resin
4. Substrate (fixing substrate)
5. Part substrate
5a. Back surface electrode
6. LED chip (light-emitting element)
7. Connecting member
8. Sealing resin
9. Fixing hole
10. Wire
21. Columnar section (fixing member, columnar member)
22. Light flux control section (light flux control member)
30. LED module (surface light-emitting unit)
31. Liquid crystal module (display device)
32. Optical sheet etc.
33. Liquid crystal panel
34. Backlight chassis
35. Reflective sheet
35a. Opening
36. Fixing member
37. Support pin
41, 41a, 41b. Electrode pattern
42. Wiring pattern
43. Recognition pattern
44. Recognition pattern

The invention claimed is:

1. A surface light-emitting unit comprising:
a fixing substrate;
a light-emitting element fixed on a fixing surface of the fixing substrate;

a light flux control member via which light from the light-emitting element is emitted, the light flux control member being supported by a plurality of support members each having a predetermined height above the fixing surface, at least one of the plurality of support members adhering to the fixing surface of the fixing substrate; and an adhesive resin made of a resin material having a white or transparent color which exhibits a smaller amount of optical absorption at a visible light region than black, the adhesive resin being located between (i) a bottom of the at least one of the plurality of support members adhering to the fixing surface and (ii) the fixing surface.

2. The surface light-emitting unit as set forth in claim 1, wherein each of the plurality of support members is a columnar member.

3. The surface light-emitting unit as set forth in claim 1, wherein each of the plurality of support members is formed integrally with the light flux control member.

4. The surface light-emitting unit as set forth in claim 1, wherein each of the plurality of support members is fixedly positioned in such a manner as to form an angle of 60° or less with respect to a long side direction of the fixing substrate which direction passes through a center of the fixing substrate in a plane view of the fixing substrate.

5. A surface light-emitting unit for emitting light from a light-emitting element via a light flux control member, the light flux control member being supported by a plurality of support members each having a predetermined height above a fixing surface of a fixing substrate on which fixing surface the light-emitting element is fixed, and at least one of the plurality of support members being adhered to the fixing surface of the fixing substrate via an adhesive resin made of a resin material whose color exhibits a smaller amount of optical absorption at a visible light region than black, wherein only one of the plurality of support members is adhered and fixed to the fixing substrate via the adhesive resin.

6. A surface light-emitting unit for emitting light from a light-emitting element via a light flux control member, the light flux control member being supported by a plurality of support members each having a predetermined height above a fixing surface of a fixing substrate on which fixing surface the light-emitting element is fixed, and at least one of the plurality of support members being adhered to the fixing surface of the fixing substrate via an adhesive resin made of a resin material whose color exhibits a smaller amount of optical absorption at a visible light region than black, wherein the plurality of support members are three or more support members, only two of which are adhered and fixed to the fixing substrate via the adhesive resin.

7. The surface light-emitting unit as set forth in claim 6, wherein the fixing substrate has a strip shape, and said only two support members which are adhered and fixed to the fixing substrate via the adhesive resin are aligned in a short side direction of the fixing substrate.

8. The surface light-emitting unit as set forth in claim 1, wherein the fixing surface of the fixing substrate has a property which exhibits a small amount of optical absorption at a visible light region.

9. The surface light-emitting unit as set forth in claim 1, wherein a reflective sheet is provided on the fixing surface of the fixing substrate.

10. The surface light-emitting unit as set forth in claim 1, wherein a resin material with high reflectance is applied on the fixing surface of the fixing substrate.

11. The surface light-emitting unit as set forth in claim 1, wherein recognition patterns indicative of positions on which the plurality of support members are fixed are provided on the fixing surface of the fixing substrate.

12. The surface light-emitting unit as set forth in claim 11, wherein each of the recognition patterns has a size which allows the recognition patterns to be covered by the adhesive resin when the plurality of support members are fixed to the fixing substrate via the adhesive resin.

13. The surface light-emitting unit as set forth in claim 11, wherein the recognition patterns include a fluorescent material excited upon irradiation with light whose wavelength is shorter than that of visible light.

14. The surface light-emitting unit as set forth in claim 11, wherein the recognition patterns include a light diffusing material.

15. The surface light-emitting unit as set forth in claim 11, wherein a color of the recognition patterns is different from a color of the adhesive resin.

16. The surface light-emitting unit as set forth in claim 11, wherein each of the recognition patterns has a ring shape at a region corresponding to an end of the plurality of support members.

17. A surface light-emitting unit for emitting light from a light-emitting element via a light flux control member, the light flux control member being supported by a plurality of support members each having a predetermined height above a fixing surface of a fixing substrate on which fixing surface the light-emitting element is fixed, and only one of the plurality of support members being adhered and fixed to the fixing surface of the fixing substrate via an adhesive resin.

18. A display device comprising:

a liquid crystal panel; and a surface light-emitting unit comprising a light-emitting element and serving as a backlight for radiating light to the liquid crystal panel from a back surface thereof, wherein the surface light-emitting unit is configured to emit light from the light-emitting element via a light flux control member, the light flux control member is supported by a plurality of support members each having a predetermined height above a fixing surface of a fixing substrate on which fixing surface the light-emitting element is fixed, at least one of the plurality of support members adheres to the fixing substrate via an adhesive resin located between each bottom of the at least one of the plurality of support members and the fixing surface so that the bottom of the at least one of the plurality of support members adheres to the fixing surface, and the adhesive resin is made of a resin material having a white or transparent color which exhibits a smaller amount of optical absorption at a visible light region than black.

* * * * *